(12) United States Patent
Hirano et al.

(10) Patent No.: US 11,256,174 B2
(45) Date of Patent: Feb. 22, 2022

(54) PATTERN FORMING PROCESS

(71) Applicant: Shin-Etsu Chemical Co., Ltd., Tokyo (JP)

(72) Inventors: Yoshinori Hirano, Annaka (JP); Hideyoshi Yanagisawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 220 days.

(21) Appl. No.: 15/901,029

(22) Filed: Feb. 21, 2018

(65) Prior Publication Data

US 2018/0239255 A1     Aug. 23, 2018

(30) Foreign Application Priority Data

Feb. 22, 2017 (JP) .............. JP2017-030714

(51) Int. Cl.
  G03F 7/36    (2006.01)
  G03F 7/20    (2006.01)
  G03F 7/16    (2006.01)
  G03F 7/039   (2006.01)
  G03F 7/38    (2006.01)

(52) U.S. Cl.
  CPC .............. G03F 7/36 (2013.01); G03F 7/0392 (2013.01); G03F 7/162 (2013.01); G03F 7/20 (2013.01); G03F 7/38 (2013.01); G03F 7/0397 (2013.01)

(58) Field of Classification Search
  CPC ..... G03F 7/38; G03F 7/40; G03F 7/36; G03F 7/0392; G03F 7/0397
  USPC ...................... 430/317, 322, 323, 326, 330
  See application file for complete search history.

(56) References Cited

U.S. PATENT DOCUMENTS

| | | | | |
|---|---|---|---|---|
| 5,024,918 A | * | 6/1991 | Porter | G03F 7/04 216/48 |
| 5,372,914 A | * | 12/1994 | Naito | G03F 7/0045 430/270.1 |
| 5,783,342 A | * | 7/1998 | Yamashita | G03F 7/70633 430/30 |
| 2002/0006578 A1 | * | 1/2002 | Kodama | C07C 381/12 430/270.1 |
| 2004/0048200 A1 | * | 3/2004 | Ishibashi | C08L 83/04 430/311 |
| 2007/0148585 A1 | * | 6/2007 | Kaneko | C08F 212/14 430/270.1 |
| 2008/0160449 A1 | * | 7/2008 | Kubo | C08F 297/00 430/286.1 |
| 2009/0291393 A1 | * | 11/2009 | Misumi | G03F 7/0233 430/286.1 |
| 2010/0104977 A1 | | 4/2010 | Hatakeyama et al. | |
| 2010/0119970 A1 | | 5/2010 | Ohsawa et al. | |
| 2011/0171577 A1 | * | 7/2011 | Tsuchimura | G03F 7/0382 430/270.1 |
| 2013/0337161 A1 | * | 12/2013 | Akimoto | C09C 3/10 427/162 |

FOREIGN PATENT DOCUMENTS

| | | |
|---|---|---|
| JP | 54-65037 A | 5/1979 |
| JP | 7-22304 A | 1/1995 |
| JP | 7-161607 A | 6/1995 |
| JP | 2004-103926 A | 4/2004 |
| JP | 2007-272087 A | 10/2007 |
| TW | 201020690 A | 6/2010 |
| TW | 201033740 A | 9/2010 |

OTHER PUBLICATIONS

Extended European Search Report dated Jul. 3, 2018, issued in counterpart European Application No. 18157353.6. (7 pages).
Office Action dated Nov. 17, 2020, issued in counterpart JP Application No. 2018-023118, with English Translation. (6 pages).
Office Action dated Apr. 13, 2021, issued in counterpart TW application No. 107105115. (6 pages).

* cited by examiner

*Primary Examiner* — John S Chu
(74) *Attorney, Agent, or Firm* — Westerman, Hattori, Daniels & Adrian, LLP

(57) ABSTRACT

A pattern is formed by (i) applying a chemically amplified positive resist composition comprising (A) a base resin, (B) a photoacid generator, (C) an organic solvent, and (D) a polyvinyl alcohol or polyvinyl alkyl ether onto a substrate to form a resist film thereon, (ii) exposing the resist film to radiation, and (iii) dry etching the resist film with an oxygen-containing gas for development. Using the chemically amplified positive resist composition, a positive pattern is formed via dry development without a need for silylation.

10 Claims, No Drawings

PATTERN FORMING PROCESS

CROSS-REFERENCE TO RELATED APPLICATION

This non-provisional application claims priority under 35 U.S.C. § 119(a) on Patent Application No. 2017-030714 filed in Japan on Feb. 22, 2017, the entire contents of which are hereby incorporated by reference.

TECHNICAL FIELD

This invention relates to a pattern forming process.

BACKGROUND ART

In the state-of-the-art of semiconductor fabrication, the resist development step relies on wet process. The development by wet process, however, encounters several problems including pattern swell, tapered profile formation, and in the case of organic solvent development, influences to the environment and human. In contrast, dry development by dry etching is devoid of such problems. Research works have heretofore been made to conduct the resist development step by dry process. In order to form a high resolution pattern by the dry development, the steps following exposure become complex as compared with the wet development. Thus the dry development has not been utilized on a commercial basis.

In some examples, the dry development process is applied to positive tone resist materials. Patent Documents 1 and 2 disclose a method involving the steps of coating a styrene or novolak-based chemically amplified positive tone resist composition onto a substrate, exposing a resist film to radiation, and treating the resist surface with a silicon base compound to form a silylated surface having etching resistance, for thereby enhancing the development contrast between the exposed and unexposed regions. Patent Document 3 describes a method involving the steps of coating a positive tone resist composition onto a substrate to form a resist film, and dry etching the resist film while the substrate temperature is controlled such that the resist film in exposed regions is left to form a negative pattern. There is a need for a positive resist composition which ensures that a positive pattern is simply formed via dry development, though at low resolution, without leaving any residues on the patterned region, and a process using the composition.

CITATION LIST

Patent Document 1: JP-A H07-022304
Patent Document 2: JP-A 2004-103926
Patent Document 3: JP-A H07-161607

SUMMARY OF INVENTION

An object of the invention is to provide a pattern forming process capable of forming a positive pattern from a chemically amplified positive resist composition via dry development without silylation.

The inventors have found that when a chemically amplified positive resist composition comprising (A) a base resin containing a polymer having an acid labile group-substituted phenolic hydroxyl group and adapted to turn alkali soluble as a result of the acid labile group being eliminated under the action of acid, (B) a photoacid generator, (C) an organic solvent, and (D) a polyvinyl alcohol or polyvinyl alkyl ether is used, a need for the silylation step after exposure is eliminated.

In one aspect, the invention provides a pattern forming process comprising the steps of (i) applying a chemically amplified positive resist composition onto a substrate to form a resist film thereon, (ii) exposing the resist film to radiation, and (iii) dry etching the exposed resist film with an oxygen-containing gas for development, the resist composition comprising (A) a base resin containing a polymer having a phenolic hydroxyl group substituted with an acid labile group and adapted to turn alkali soluble as a result of the acid labile group being eliminated under the action of acid, (B) a photoacid generator, (C) an organic solvent, and (D) a polyvinyl alcohol or polyvinyl alkyl ether. Notably the applying step (i) encompasses coating the resist composition in solution form to the substrate, attaching the resist composition in film form to the substrate, and otherwise processing the resist composition to form a film on the substrate.

The process may further include (i-2) heat treatment step between steps (i) and (ii), and (ii-2) heat treatment step between steps (ii) and (iii).

In one preferred embodiment, the chemically amplified positive resist composition takes a film form.

Typically, the exposure step (ii) uses radiation of wavelength 300 to 500 nm.

Advantageous Effects of Invention

The pattern forming process of the invention ensures that a positive pattern is formed from a chemically amplified positive resist composition via dry development without a need for silylation of resist film surface. A pattern without surface contaminants like $SiO_2$ is formed by a brief process.

DESCRIPTION OF PREFERRED EMBODIMENTS

The notation ($C_n$-$C_m$) means a group containing from n to m carbon atoms per group.

The abbreviations and acronyms have the following meaning.
UV: ultraviolet radiation
EB: electron beam
Mw: weight average molecular weight
Mw/Mn: molecular weight distribution or dispersity
GPC: gel permeation chromatography
PEB: post-exposure baking
PAG: photoacid generator The pattern forming process of the invention uses a chemically amplified positive resist composition, which is described below. The chemically amplified positive resist composition is defined as comprising (A) a base resin containing a polymer having a phenolic hydroxyl group substituted with an acid labile group and adapted to turn alkali soluble as a result of the acid labile group being eliminated under the action of acid, (B) a photoacid generator, (C) an organic solvent, and (D) a polyvinyl alcohol or polyvinyl alkyl ether.

(A) Base Resin

Component (A) is a base resin containing a polymer having a phenolic hydroxyl group substituted with an acid labile group and adapted to turn alkali soluble as a result of the acid labile group being eliminated under the action of acid. The polymer is referred to as Polymer A, hereinafter. Typical of Polymer A is a polymer comprising recurring units derived from hydroxystyrene or a derivative thereof wherein at least one (one or more or even all) hydrogen atom of a phenolic hydroxyl group is substituted by an acid labile group. The preferred Polymer A is a polymer comprising recurring units having the formula (1-1) and recurring units having the formula (1-2).

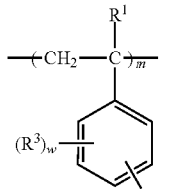

(1-1)

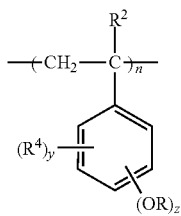

(1-2)

In formulae (1-1) and (1-2), $R^1$ and $R^2$ are each independently hydrogen, hydroxyl, straight or branched $C_1$-$C_6$ alkyl group, halogen, or trifluoromethyl. $R^3$ is halogen or a straight, branched or cyclic $C_1$-$C_8$ alkyl group, and where two or more groups $R^3$ are included, they may be identical or different. $R^4$ is hydroxyl, halogen, or a straight, branched or cyclic $C_1$-$C_8$ alkyl group, and where two or more groups $R^4$ are included, they may be identical or different. The subscripts m and n are numbers in the range: $0 \leq m < 1$, $0 < n \leq 1$, and $0 < m+n \leq 1$, preferably $0 < m < 1$ and $0 < n < 1$, more preferably $0.3 \leq m \leq 0.9$ and $0.1 \leq n \leq 0.7$, and even more preferably $0.5 \leq m \leq 0.8$ and $0.2 \leq n \leq 0.5$.

In formula (1-1), w and x are integers in the range: $0 \leq w \leq 4$, $1 \leq x \leq 5$, and $1 \leq w+x \leq 5$, preferably $0 \leq w \leq 2$ and $1 \leq x \leq 2$. In formula (1-2), y and z are integers in the range: $0 \leq y \leq 4$, $1 \leq z \leq 5$, and $1 \leq y+z \leq 5$, preferably $0 \leq y \leq 2$ and $1 \leq z \leq 2$.

Examples of the $C_1$-$C_8$ alkyl group represented by $R^3$ and $R^4$ include methyl, ethyl, n-propyl, isopropyl, n-butyl, isobutyl, sec-butyl, tert-butyl, n-pentyl, isopentyl, tert-pentyl, n-hexyl, and n-heptyl. Inter alia, methyl, ethyl, n-propyl and isopropyl are preferred. At least one (one or more or even all) hydrogen atom on the alkyl group may be substituted by halogen such as fluorine, and suitable halo-substituted alkyl groups include fluoromethyl, difluoromethyl, trifluoromethyl, 2,2,2-trifluoroethyl, and pentafluoroethyl.

In formula (1-2), R is an acid labile group. The acid labile group is selected from a variety of such groups, preferably from groups of the formula (2-1), groups of the formula (2-2), groups of the formula (2-3), shown below, trialkylsilyl groups, and ketoalkyl groups.

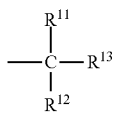

(2-1)

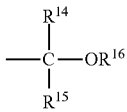

(2-2)

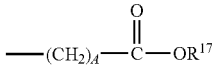

(2-3)

In formula (2-1), $R^{11}$ to $R^{13}$ are each independently a $C_1$-$C_8$ straight, branched or cyclic alkyl group. A pair of $R^{11}$ and $R^{12}$, $R^{11}$ and $R^{13}$, or $R^{12}$ and $R^{13}$ may bond together to form a ring with the carbon atom to which they are attached. Each participant of $R^{11}$, $R^{12}$ and $R^{13}$ is independently a $C_1$-$C_{16}$ straight or branched alkylene group when they form a ring.

In formula (2-2), $R^{14}$ and $R^{15}$ are each independently hydrogen or a $C_1$-$C_8$ straight or branched alkyl group. $R^{16}$ is a $C_1$-$C_{10}$ straight, branched or cyclic alkyl group. A pair of $R^{14}$ and $R^{15}$, $R^{14}$ and $R^{16}$, or $R^{15}$ and $R^{16}$ may bond together to form a ring with the carbon atom or the carbon and oxygen atoms to which they are attached. Each participant of $R^{14}$, $R^{15}$ and $R^{16}$ is independently a $C_1$-$C_6$ straight or branched alkylene group when they form a ring.

In formula (2-3), $R^{17}$ is a $C_4$-$C_{40}$ tertiary alkyl group, and "A" is an integer of 0 to 6.

Examples of the $C_1$-$C_8$ alkyl group represented by $R^1$ to $R^{15}$ are as exemplified above. The $C_4$-$C_{40}$ tertiary alkyl groups are preferably those of 4 to 12 carbon atoms, more preferably 4 to 8 carbon atoms, and even more preferably 4 to 6 carbon atoms, specifically tert-butyl, tert-pentyl and tert-hexyl.

Examples of the group having formula (2-1) include tert-butyl, tert-pentyl and 1-methylcyclohexyl.

Examples of the group having formula (2-2) include 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-pentyloxyethyl, 1-methoxy-1-propyl, 1-ethoxy-1-propyl, 2-methoxy-2-propyl, 2-ethoxy-2-propyl, 1-cyclohexyloxyethyl, tetrahydropyranyl, and tetrahydrofuranyl. Inter alia, 1-ethoxyethyl and 1-ethoxy-1-propyl are preferred.

Examples of the group having formula (2-3) include tert-butoxycarbonyl, tert-butoxycarbonylmethyl, tert-pentyloxycarbonyl, 1-methylcyclopentyloxycarbonyl, 1-ethylcyclopentyloxycarbonyl, 1-ethylcyclohexyloxycarbonyl, and tert-pentyloxycarbonylmethyl.

Suitable trialkylsilyl groups include those wherein each alkyl moiety has 1 to 6 carbon atoms, such as trimethylsilyl, triethylsilyl and dimethyl-tert-butylsilyl. Suitable ketoalkyl groups include 3-oxocyclohexyl and groups of the following formulae.

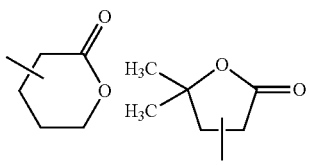

A more preferred embodiment of Polymer A is a polymer comprising recurring units having formulae (3-1) to (3-4).

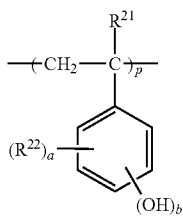 (3-1)

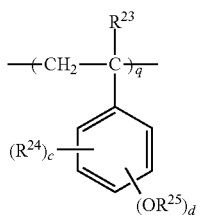 (3-2)

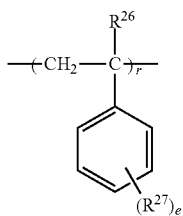 (3-3)

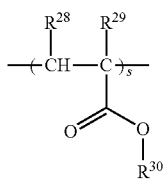 (3-4)

Herein $R^{21}$, $R^{23}$ and $R^{26}$ are each independently hydrogen, hydroxyl, a $C_1$-$C_6$ straight or branched alkyl group, halogen, or trifluoromethyl group.

In formula (3-1), $R^{22}$ is halogen or a $C_1$-$C_8$ straight, branched or cyclic alkyl group. Where two or more groups $R^{22}$ are present (i.e., a is at least 2), they may be identical or different. The subscripts a and b each are an integer in the range: $0 \leq a \leq 4$, $1 \leq b \leq 5$, and $1 \leq a+b \leq 5$, preferably $0 \leq a \leq 2$ and $1 \leq b \leq 2$.

In formula (3-2), $R^{24}$ is hydroxyl, halogen or a $C_1$-$C_8$ straight, branched or cyclic alkyl group. Where two or more groups $R^{24}$ are present (i.e., c is at least 2), they may be identical or different. $R^{25}$ is an acid labile group. The acid labile group represented by $R^{25}$ is as exemplified above for R, and preferably a group of formula (2-1) or a group of formula (2-2). The subscripts c and d each are an integer in the range: $0 \leq c \leq 4$, $1 \leq d \leq 5$, and $1 \leq c+d \leq 5$, preferably $0 \leq c \leq 2$ and $1 \leq d \leq 2$.

In formula (3-3), $R^{27}$ is a $C_1$-$C_{12}$ alkyl group which may be substituted with fluorine, a $C_1$-$C_{12}$ primary or secondary alkoxy group which may be substituted with fluorine, —C(CF$_3$)$_2$—OH, or a trialkylsilyl group in which each alkyl moiety has 1 to 6 carbon atoms. The subscript e is an integer of 0 to 5, preferably 0 to 4.

In formula (3-4), $R^{28}$ is hydrogen or methyl. $R^{29}$ is hydrogen, methyl, $C_2$-$C_6$ alkoxycarbonyl, cyano, halogen or trifluoromethyl. $R^{30}$ is a substituted or unsubstituted $C_4$-$C_{30}$ straight, branched or cyclic alkyl group.

Of the foregoing groups, suitable alkyl groups are as exemplified above. Suitable halogen atoms include fluorine, chlorine and bromine. Suitable $C_1$-$C_{12}$ alkoxy groups include methoxy, ethoxy, n-propoxy, isopropoxy, n-butoxy, isobutoxy, sec-butoxy, n-pentyloxy, cyclopentyloxy, n-hexyloxy, cyclohexyloxy, cyclooctyloxy, and cyclononyloxy.

When $R^{30}$ is a tertiary alkyl group, a group having the formula (4-1) or (4-2) is preferred.

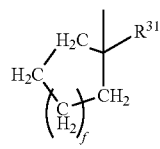 (4-1)

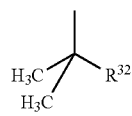 (4-2)

In formula (4-1), $R^{31}$ is methyl, ethyl, isopropyl, cyclohexyl, cyclopentyl, vinyl, acetyl, phenyl, benzyl or cyano; and f is an integer of 0 to 3. In formula (4-2), $R^{32}$ is methyl, ethyl, isopropyl, cyclohexyl, cyclopentyl, vinyl, phenyl, benzyl or cyano.

The group having formula (4-1) is preferably a 5- or 6-membered ring. Examples include 1-methylcyclopentyl, 1-ethylcyclopentyl, 1-isopropylcyclopentyl, 1-vinyl-cyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Examples of the group having formula (4-2) include tert-butyl, 1-vinyldimethylmethyl, 1-benzyldimethylmethyl, 1-phenyldimethylmethyl, and 1-cyanodimethylmethyl.

The cyclic tertiary alkyl groups shown below are also preferred examples of $R^{30}$

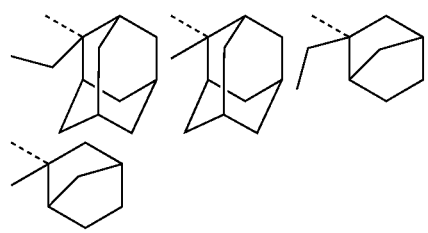

Herein the broken line designates a valence bond.

In formulae (3-1) to (3-4), p, q, r and s are numbers satisfying $0 \leq p < 1$, $0 < q \leq 1$, $0 \leq r < 1$, $0 \leq s < 1$, and $p+q+r+s=1$; preferably $0.2 \leq p \leq 0.8$, $0.1 \leq q \leq 0.8$, $0 \leq r \leq 0.35$, and $0 \leq s \leq 0.35$; more preferably $0.25 \leq p \leq 0.75$, $0.1 \leq q \leq 0.45$, $0 \leq r \leq 0.35$, and $0.05 \leq s \leq 0.3$. A proper choice of values of p, q, r and s from the ranges enables to control the dissolution contrast and dissolution rate of a resist film and hence, to control the size and profile of a resist pattern.

Of the polymers comprising units having formulae (3-1) to (3-4), binary polymer (A-1), ternary polymers (A-2), (A-3) and (A-4), and quaternary polymer (A-5), all shown below, are preferred. It is noted that $R^{21}$ to $R^{30}$, and a to e in the following formulae are as defined above.

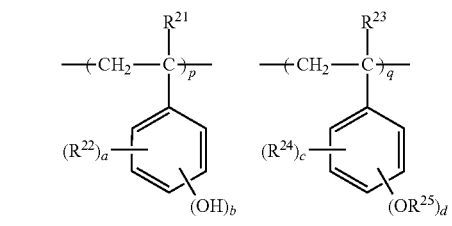
$(0.2 \leq p \leq 0.8, 0.2 \leq q \leq 0.8, p + q = 1)$
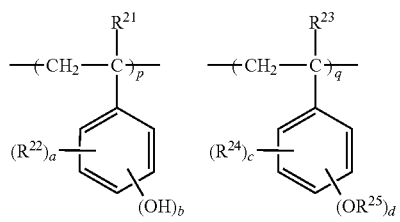
$(0.2 \leq p \leq 0.8, 0 < q \leq 0.5, 0 < s \leq 0.3, p + q + s = 1)$
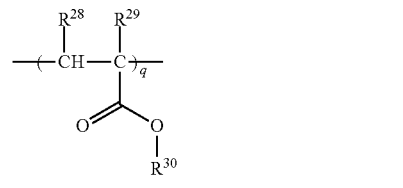
$(0.1 \leq p \leq 0.8, 0 < q \leq 0.5, 0.1 \leq r \leq 0.5, p + q + r = 1)$
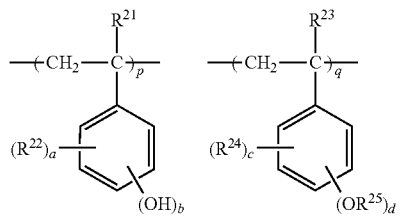
$(0.2 \leq q < 0.8, 0.2 \leq r < 0.5, 0 < s \leq 0.3, q + r + s = 1)$
(A-1)
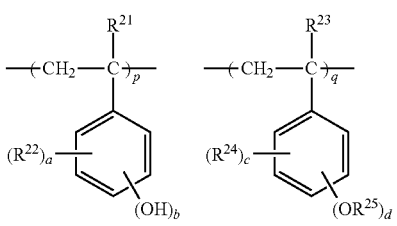
(A-2)
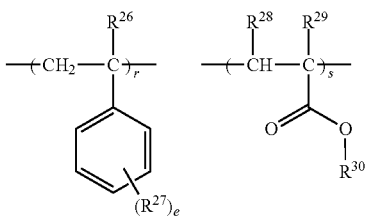
$(0.3 \leq p \leq 0.8, 0 < q \leq 0.5, 0.1 \leq r \leq 0.5, 0 < s \leq 0.3, p + q + r + s = 1)$
Specific examples of Polymer A are shown below, but are not limited thereto.
(A-3)
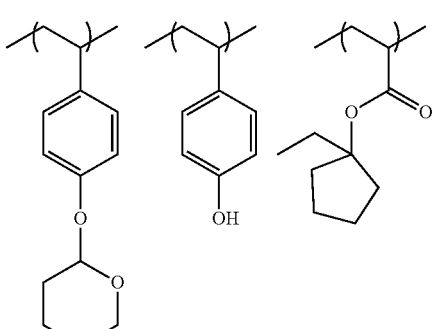
(A-4)
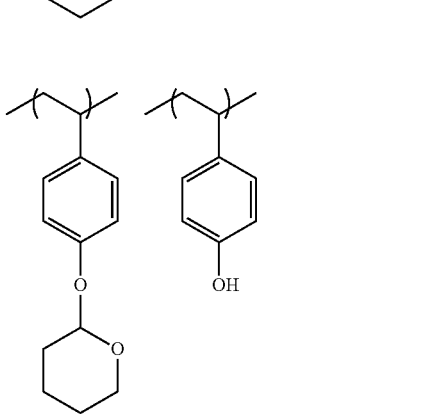

-continued

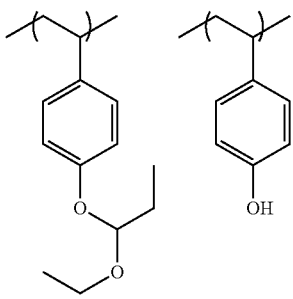

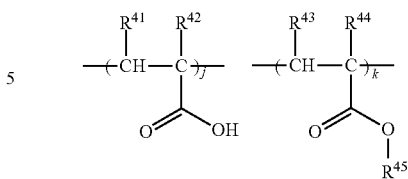

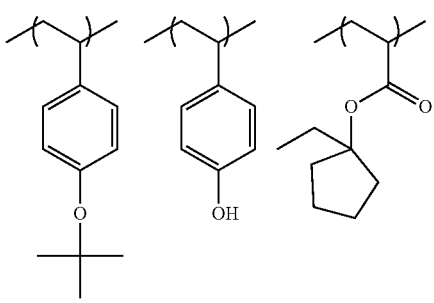

Herein $R^{41}$ and $R^{43}$ are each independently hydrogen or methyl; $R^{42}$ and $R^{44}$ are each independently hydrogen, methyl, $C_2$-$C_6$ alkoxycarbonyl, cyano, halogen, or trifluoromethyl; $R^{45}$ is a substituted or unsubstituted $C_1$-$C_{30}$ straight or branched alkyl group, $C_4$-$C_{30}$ cycloalkyl group, $C_4$-$C_{30}$ lactone ring-containing group, or $C_1$-$C_{24}$ monovalent organic group containing oxygen, sulfur or nitrogen; j and k are numbers satisfying $0 \leq j < 1$, $0 < k \leq 1$, and $j+k=1$.

An amount of the acrylic polymer used is 0 to 100 parts by weight per 100 parts by weight of Polymer A, and when used, preferably 5 to 50 parts by weight. The acrylic polymer may be used alone or in a combination of two or more.

(B) Photoacid Generator

The PAG as component (B) is not particularly limited as long as it is a compound capable of generating an acid upon exposure to high-energy radiation. Examples of high-energy radiation include UV, deep-UV and EB, specifically g-line, h-line, i-line, KrF excimer laser, ArF excimer laser, EB, and synchrotron radiation.

Preferred PAGs are sulfonium salts, iodonium salts, sulfonyldiazomethane, N-sulfonyloxyimide, benzoin sulfonate, pyrogallol trisulfonate, nitrobenzyl sulfonate, sulfone, and O-arylsulfonyloxime or O-alkylsulfonyloxime (oxime sulfonate) acid generators.

Sulfonium salts are salts of sulfonium cations with sulfonate anions. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are preferred.

Iodonium salts are salts of iodonium cations with sulfonate anions. Exemplary iodonium cations are aryliodonium cations including diphenyliodonium, bis(4-tert-butylphenyl)iodonium, 4-tert-butoxyphenylphenyliodonium, and 4-methoxyphenylphenyliodonium. Exemplary

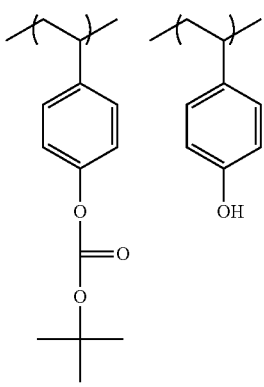

Polymer A should preferably have a Mw of 1,000 to 500,000, more preferably 2,000 to 30,000, as measured by GPC versus polystyrene standards using tetrahydrofuran solvent. This range of Mw ensures heat resistance and sufficient alkaline solubility, avoiding a footing phenomenon after pattern formation. It is noted throughout the disclosure that Mw is measured versus polystyrene standards by GPC using tetrahydrofuran (THF) solvent.

With respect to the recurring units having formulae (1-1) and (1-2) and the recurring units having formulae (3-1) to (3-4), units of only one type or plural types may be contained in the molecule.

Polymer A may be used alone or in a combination of two or more.

In addition to Polymer A, the base resin may contain an acrylic polymer comprising recurring units which are derived from a (meth)acrylate and have an acid labile group on side chain. Preferred is an acrylic polymer comprising recurring units of the formula (5) and having a Mw of 1,000 to 500,000.

sulfonate anions include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are preferred.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis (2-methylpropylsulfonyl)diazomethane, bis(1,1-dimethylethylsulfonyl)diazomethane, bis (cyclohexylsulfonyl)diazomethane, bis (perfluoroisopropylsulfonyl)diazomethane, bis (phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide PAGs include imide compounds having nitrogen-bonded hydrogen replaced by a sulfonyloxy group. Exemplary imide skeletons include succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonyloxy groups include trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Benzoinsulfonate PAGs include benzoin tosylate, benzoin mesylate, and benzoin butanesulfonate.

Pyrogallol trisulfonate PAGs include pyrogallol, phloroglucinol, catechol, resorcinol, and hydroquinone, in which all hydroxyl groups are replaced by sulfonyloxy groups such as trifluoromethanesulfonyloxy, nonafluorobutanesulfonyloxy, heptadecafluorooctanesulfonyloxy, 2,2,2-trifluoroethanesulfonyloxy, pentafluorobenzenesulfonyloxy, 4-trifluoromethylbenzenesulfonyloxy, 4-fluorobenzenesulfonyloxy, toluenesulfonyloxy, benzenesulfonyloxy, naphthalenesulfonyloxy, camphorsulfonyloxy, octanesulfonyloxy, dodecylbenzenesulfonyloxy, butanesulfonyloxy, and methanesulfonyloxy.

Nitrobenzyl sulfonate PAGs include esters of nitrobenzyl alcohols with sulfonic acids, such as 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group is replaced by trifluoromethyl.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime or O-alkylsulfonyloxime (oxime sulfonate) PAGs include glyoxime derivatives, oxime sulfonates with a long conjugated system separated by thiophene or cyclohexadiene, oxime sulfonates having an electron withdrawing group such as trifluoromethyl incorporated for increased stability, oxime sulfonates using substituted acetonitrile derivatives such as phenylacetonitrile, and bisoxime sulfonates.

Glyoxime derivative PAGs include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedione dioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)nioxime, bis-O-(2,2,2-trifluoroethanesulfonyl)nioxime, bis-O-(10-camphorsulfonyl)nioxime, bis-O-(benzenesulfonyl)nioxime, bis-O-(4-fluorobenzenesulfonyl)nioxime, bis-O-(4-trifluoromethylbenzenesulfonyl)nioxime, and bis-O-(xylenesulfonyl)nioxime.

PAGs in the form of oxime sulfonates with a long conjugated system separated by thiophene or cyclohexadiene include (5-(p-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene) phenylacetonitrile, (5-(p-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, (5-(4-(p-toluenesulfonyloxy)benzenesulfonyl)oxyimino-5H-thiophen-2-ylidene)-phenylacetonitrile, and (5-(2,5-bis(p-toluenesulfonyloxy)benzenesulfonyl)oxyimino-5H-thiophen-2-ylidene)-phenylacetonitrile.

Suitable oxime sulfonates having an electron withdrawing group such as trifluoromethyl incorporated for increased stability include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)oxime, 2,2,2-trifluoro-1-phenylethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphorsulfonyl)oxime, 2,2,2-trifluoro-1-(4-methylphenyl)ethanone O-(methylsulfonyl)oxime, 2,2,2-trifluoro-1-(2-methylphenyl)ethanone O-(10- camphorsulfonyl)oxime, 2,2,2-trifluoro-1-(2,4-dimethylphenyl)ethanone O-(10-camphorsulfonyl)oxime, 2,2,2-trifluoro-1-(2,4-dimethylphenyl)ethanone O-(1-naphthylsulfonyl)oxime, 2,2,2-trifluoro-1-(2,4-dimethylphenyl)-ethanone O-(2-naphthylsulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)-ethanone O-(methylsulfonyl)oxime, 2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxyphenylsulfonyl)oxime, 2,2,2-trifluoro-1-(4-methoxyphenyl)ethanone O-(4-dodecylphenylsulfonyl)oxime, 2,2,2-trifluoro-1-(4-methoxyphenyl)ethanone O-(octylsulfonyl)oxime, 2,2,2-trifluoro-1-(4-thiomethylphenyl)ethanone O-(4-methoxyphenylsulfonyl)oxime, 2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)ethanone O-(phenylsulfonyl)oxime, 2,2,2-trifluoro-1-(4-chlorophenyl)ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl)ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methylcarbonyloxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone O-(propylsulfonyl)oxime, 2,2,2-trifluoro-1-(2-thiophenyl)ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoromethanesulfonyloxyimino)ethyl)-phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino)ethyl)phenoxy)-propoxy)phenyl)ethanone O-(propylsulfonyl)oxime, 2,2,2-trifluoro-1-(4-(3-(4-(2,2,2-trifluoro-1-(1-butanesulfonyloxyimino)ethyl)phenoxy)-propoxy)phenyl)ethanone O-(butylsulfonyl)oxime, 2,2,2-trifluoro-1-(4-(3-(4-(2,2,2-trifluoro-1-(4-(4-methylphenylsulfonyloxy)-phenylsulfonyloxyimino)ethyl) phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-((2,5-bis(4-methylphenylsulfonyloxy)-benzenesulfonyloxy)phenylsulfonyloxyimino)ethyl)phenoxy)propoxy)phenyl)ethanone O-((2,5-bis(4-methylphenylsulfonyloxy)benzenesulfonyloxy)phenylsulfonyl)oxime.

Suitable oxime sulfonate PAGs using substituted acetonitrile derivatives include 4-methylphenylsulfonyloxyimino-α-(4-methoxyphenyl)acetonitrile, α-(p-toluenesulfonyloxyimino)phenylacetonitrile, α-(p-chlorobenzenesulfonyloxyimino)phenylacetonitrile, α-(4-nitrobenzenesulfonyloxyimino)phenylacetonitrile, α-(4-nitro-2-trifluoromethylbenzene sulfonyloxyimino) phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Suitable bisoxime sulfonate PAGs include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, and bis(α-(4-methoxybenzenesulfonyloxy)imino)-m-phenylenediacetonitrile.

Also oxime sulfonates having the formula (Ox-1) are useful as the PAG.

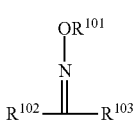

(Ox-1)

Herein $R^{101}$ is a substituted or unsubstituted $C_1$-$C_{10}$ haloalkylsulfonyl or halobenzenesulfonyl group, $R^{102}$ is a $C_1$-$C_{11}$ haloalkyl group, and $R^{103}$ is a substituted or unsubstituted aryl or hetero-aryl group.

Examples of the oxime sulfonate having formula (Ox-1) include 2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-(nonafluorobutylsulfonyloxyimino)hexyl]fluorene, 2-[2,2,3,3,4,4,5,5-octafluoro-1-(nonafluorobutylsulfonyloxyimino)pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl.

Among these, the preferred PAGs are sulfonium salts, bissulfonyldiazomethane, N-sulfonyloxyimide, and sulfonyloxime compounds.

Although the optimum anion of the generated acid varies with such factors as ease of scission of the acid labile group in the polymer, an anion which is non-volatile and not extremely highly diffusive is generally selected. Appropriate anions include anions of benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid.

The PAG (B) is added in an amount of 0.2 to 20 parts, preferably 0.3 to 10 parts by weight per 100 parts by weight of the base resin (A). Practically acceptable sensitivity and pattern profile are available as long as the PAG amount is in the range. The PAG may be used alone or in admixture of two or more. The transmittance of the resist film can be controlled by using a PAG having a low transmittance at the exposure wavelength and adjusting the amount of the PAG added.

(C) Organic Solvent

The organic solvent as component (C) is not particularly limited as long as it has a sufficient solubility relative to other components and a film-forming ability. Suitable organic solvents include cellosolve solvents such as methyl cellosolve, ethyl cellosolve, methyl cellosolve acetate, and ethyl cellosolve acetate; propylene glycol solvents such as propylene glycol and dipropylene glycol; propylene glycol alkyl ether solvents such as propylene glycol monomethyl ether and propylene glycol monobutyl ether; propylene glycol alkyl ether acetate solvents such as propylene glycol monomethyl ether acetate (PGMEA), propylene glycol dimethyl ether, and propylene glycol monoethyl ether acetate; ester solvents such as butyl acetate, pentyl acetate, methyl lactate, ethyl lactate, methyl 3-methoxypropionate, and ethyl 3-ethoxypropionate; alcohol solvents such as methanol, ethanol, isopropanol, butanol, hexanol and diacetone alcohol; ketone solvents such as acetone, cyclohexanone, cyclopentanone, methyl ethyl ketone, methyl pentyl ketone and methyl isobutyl ketone; ether solvents such as methyl phenyl ether and diethylene glycol dimethyl ether; highly polar solvents such as N,N-dimethylformamide, N-methylpyrrolidone, and dimethyl sulfoxide; and mixtures thereof.

Of these solvents, propylene glycol alkyl ether acetates, alkyl lactates, and alkyl ketones are preferred. The solvents may be used alone or in admixture. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. Also, the alkyl group of the alkyl lactate is preferably of 1 to 4 carbon atoms, for example, methyl, ethyl and propyl, with methyl and ethyl being especially preferred. The alkyl group of the alkyl ketone is preferably of 1 to 10 carbon atoms, for example, methyl, ethyl, propyl, isobutyl, cyclopentyl and cyclohexyl, with isobutyl, cyclopentyl and cyclohexyl being especially preferred.

In the resist composition, the organic solvent (C) is preferably used in an amount of 20 to 1,000 parts, more preferably 30 to 800 parts by weight per 100 parts by weight of the base resin (A).

(D) Polyvinyl Alcohol or Polyvinyl Alkyl Ether

Component (D) is a polyvinyl alcohol or a polyvinyl alkyl ether obtained by converting the hydroxyl group on a polyvinyl alcohol to an alkyl ether group. In the case of polyvinyl alkyl ether, the length of an alkyl ether group is preferably of 1 to 10 carbon atoms, and the alkyl moiety may be straight, branched or cyclic. Preferred are $C_1$-$C_4$ alkyl ether groups such as methyl ether, ethyl ether, propyl ether, and butyl ether.

The polyvinyl alcohol used herein may be a saponified product of polyvinyl acetate, preferably having a saponification degree of 60 to 99.5 mol %, more preferably 70 to 99 mol %.

The polyvinyl alcohol or polyvinyl alkyl ether should preferably have a Mw of 1,000 to 500,000, more preferably 1,500 to 50,000. A polyvinyl alcohol or polyvinyl alkyl ether having a Mw in the range is fully soluble in the organic solvent.

In the resist composition, the polyvinyl alcohol or polyvinyl alkyl ether (D) is preferably used in an amount of 1 to 100 parts, more preferably 5 to 50 parts by weight per 100 parts by weight of the base resin (A). Component (D) may be used alone or in admixture. As long as the amount of component (D) is within the range, advantages including a sufficient difference in etching rate between exposed and unexposed regions during dry etching and a high contrast are obtained without detrimental impact on efficient coating of the composition to the substrate.

(E) Basic Compound

In one preferred embodiment, the resist composition may further contain (E) a basic compound. The basic compound (E) is preferably a compound capable of suppressing the rate of diffusion when the acid generated by the PAG diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of the basic compound (E) include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, t-butylamine, pentylamine, t-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-t-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Further, amine compounds of the following formula (E-1) may be added alone or in admixture as the basic compound.

$$N(X^1)_{g-3}(X^2)_g \quad (E-1)$$

In the formula, g is equal to 1, 2 or 3; $X^1$ is independently hydrogen or a $C_1$-$C_{20}$ straight, branched or cyclic alkyl group which may contain a hydroxyl or ether moiety; and $X^2$ is independently selected from groups of the following formulae (E-2) to (E-4), and two or three $X^2$ may bond together to form a ring with the nitrogen atom to which they are attached.

(E-2)

(E-3)

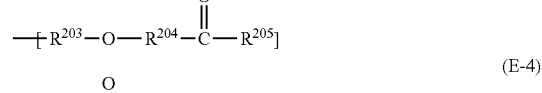
(E-4)

In the formulae, $R^{201}$, $R^{203}$ and $R^{206}$ are independently a $C_1$-$C_4$ straight or branched alkylene group. $R^{202}$ and $R^{205}$ are independently hydrogen, or a $C_1$-$C_{20}$ straight, branched or cyclic alkyl group which may contain at least one hydroxyl, ether or ester moiety or lactone ring. $R^{204}$ is a single bond or a $C_1$-$C_4$ straight or branched alkylene group. $R^{207}$ is a $C_1$-$C_{20}$ straight, branched or cyclic alkyl group which may contain at least one hydroxyl, ether or ester moiety or lactone ring.

Illustrative examples of the basic compound having formula (E-1) include tris(2-methoxymethoxyethyl)amine, tris{2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris (2-pivaloyloxyethyl)amine, N,N-bis(2-acetoxyethyl)-2-(acetoxyacetoxy)ethylamine, tris(2-methoxycarbonyloxyethyl)amine, tris(2-t- butoxycarbonyloxyethyl)amine, tris[2-(2-oxopropoxy)ethyl]amine, tris[2-(methoxycarbonylmethyl)oxyethyl]amine, tris[2-(t-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-aetxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-aetxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-aetxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-aetxyethyl)-bis[2-(methoxycarbonyl)ethyl]amine, N-(2-hydroxyethyl)-bis[2-(ethoxycarbonyl)ethyl]amine, N-(2-aetxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compound (E) is preferably formulated in an amount of 0 to 5 parts, and especially 0.01 to 2 parts by weight per 100 parts by weight of the base resin (A). An amount of the basic compound in the range may avoid any loss of sensitivity. The basic compounds may be used alone or in admixture.

(F) Surfactant

The resist composition may further contain (F) a surfactant, if necessary. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-4430, FC-430 and FC-431 (Sumitomo 3M Co., Ltd.), Surfynol E1004 (Nissin Chemical Industry Co., Ltd.), Asahiguard AG710, Surflon S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430, KP-341 and X-70-093 are preferred. These surfactants may be used alone or in admixture.

The surfactant is preferably formulated in an amount of 0 to 5 parts, and more preferably 0.01 to 2 parts by weight per 100 parts by weight of the base resin (A).

(G) Polyester Resin

If desired, the resist composition may further contain (G) a polyester resin. The polyester resin (G), which has an ester bond in its backbone, is preferably a condensate of a polyfunctional carboxylic acid with a polyhydric alcohol (commonly known as polyester). It may also be a condensate of a polyfunctional carboxylic anhydride with a polyhydric alcohol.

The polyfunctional carboxylic acids are preferably those having 2 to 6 carboxyl groups. Examples include oxalic acid, succinic acid, malonic acid, glutaric acid, adipic acid, pimelic acid, suberic acid, azelaic acid, sebacic acid, brassilic acid, methylmalonic acid, citraconic acid, fumaric acid, maleic acid, methylmaleic acid, mesaconic acid, glutaconic acid, itaconic acid, allylmalonic acid, teraconic acid, muconic acid, butynedioic acid, aconitic acid, malic acid, tartaric acid, racemic acid, citric acid, oxomalonic acid, oxosuccinic acid, thiomalic acid, glutamic acid, ethylene diamine tetraacetic acid, 1,2-cyclopropanedicarboxylic acid, truxillic acid, camphoric acid, phthalic acid, isophthalic acid, terephthalic acid, phenylsuccinic acid, 2-(3-carboxyphenyl)-2-oxoacetic acid, meconic acid, and cyclobutanedicarboxylic acid. Anhydrides of the foregoing acids are also useful. Of these, difunctional carboxylic acids are preferred. The polyfunctional carboxylic acids may be used alone or in admixture.

Suitable polyhydric alcohols include 1,2-propanediol, 1,3-propanediol, 1,2-butanediol, 1,3-butanediol, 3-methyl-1,3-butanediol, 1,4-butanediol, 1,4-cyclohexanemethanediol, 1,2-pentanediol, 1,3-pentanediol, 1,5-pentanediol, 1,6-hexanediol, 2-methyl-2,4-pentanediol, 3-methyl-1,5-pentanediol, ethylene glycol, propylene glycol, neopentyl glycol, glycerol, and pentaglycerol. Of these, dihydric alcohols are preferred. The polyhydric alcohols may be used alone or in admixture.

Condensation polymerization of these reactants may be carried out by a well-known method. The amounts of reactants may be adjusted in accordance with the desired molecular weight of the resulting polymer. Typically, about 0.5 to 3 moles of the polyhydric alcohol is used per mole of the polyfunctional carboxylic acid.

Esterification may accord with a well-known method. Typically polycondensation may be performed by using an acidic catalyst such as sulfuric acid and a metal compound such as a titanium, tin, zinc, germanium or antimony compound, and optionally heating at a temperature of about 50 to 300° C.

The polyester resin (G) preferably has a Mw of 700 to 50,000, more preferably 1,500 to 45,000.

The polyester resin (G) is preferably formulated in an amount of 0 to 100 parts, more preferably 10 to 60 parts, and even more preferably 15 to 50 parts by weight per 100 parts by weight of the base resin (A). An amount of the resin in the range ensures to form a flexible film and eliminates the risk of voids forming on a stepped substrate. The resin may be used alone or in admixture.

(H) Carboxylic Acid

The resist composition may further contain (H) a carboxylic acid, which is typically selected from saturated or unsaturated aliphatic carboxylic acids, alicyclic carboxylic acids, oxy carboxylic acids, alkoxy carboxylic acids, keto carboxylic acids, and aromatic carboxylic acids.

Suitable saturated aliphatic carboxylic acids are mono- or polyfunctional carboxylic acids including formic acid, acetic acid, propionic acid, butyric acid, isobutyric acid, valeric acid, caproic acid, enanthic acid, oxalic acid, malonic acid, succinic acid, glutaric acid, adipic acid, pimelic acid, and suberic acid. Suitable unsaturated aliphatic carboxylic acids include acrylic acid, crotonic acid, isocrotonic acid, 3-butenoic acid, methacrylic acid, 4-pentenoic acid, propionic acid, 2-butynoic acid, maleic acid, and fumaric acid. Typical of the oxy carboxylic acid is oxyacetic acid. Typical of the alkoxy carboxylic acid is methoxyacetic acid. Typical of the keto carboxylic acid is pyruvic acid. Suitable aromatic carboxylic acids include benzoic acid, p-hydroxybenzoic acid, o-hydroxybenzoic acid, phthalic acid, terephthalic acid and isophthalic acid. Of these, dicarboxylic acids are preferred, with saturated aliphatic dicarboxylic acids being most preferred.

An appropriate amount of carboxylic acid used is 0 to 1 part, more preferably 0.0001 to 0.5 part by weight per 100 parts by weight of the base resin (A). An amount of the carboxylic acid in the range may not adversely affect adhesion. The carboxylic acid may be used alone or in admixture.

Other Components

In the resist composition, other optional components may be added, for example, benzotriazole compounds, imidazole compounds, dissolution accelerators for accelerating an alkaline development rate, light absorbing substances for reducing diffuse reflection from the substrate, compounds having 1,2-naphthoquinonediazidesulfonyl group in the molecule, sensitizers, crosslinkers, photobase generators, and acid amplifiers. Such optional components may be added in conventional amounts as long as they do not compromise the benefits of the invention.

Suitable light absorbing substances are dyes including azo compounds such as 2-benzeneazo-4-methylphenol and 4-hydroxy-4'-dimethylaminoazobenzene, and curcumin.

The chemically amplified positive resist composition may be prepared as a uniform solution by dissolving the base resin (A), photoacid generator (B), polyvinyl alcohol or polyvinyl alkyl ether (D), and optional components (E) to (H) in the organic solvent (C) all at once or in arbitrary order. If desired, the solution may be filtered through a filter.

Pattern Forming Process

The invention provides a pattern forming process comprising the following steps (i) to (iii).

Step (i)

Step (i) is to apply the chemically amplified positive resist composition onto a substrate to form a chemically amplified positive resist film thereon.

In one embodiment, the resist film is formed by directly coating the chemically amplified positive resist composition onto the substrate. The coating method may be any prior art well-known method. Specifically, the substrate may be selected from substrates of Si, $SiO_2$, SiN, SiON, TiN, WSi, BPSG and SOG, metal substrates of Au, Ti, W, Cu, Ni—Fe, Ta, Zn, Co and Pb, organic substrates such as organic antireflective coatings, and glass substrates. The coating technique may be spin coating, roll coating, flow coating, dip coating, spray coating, or doctor blade coating. The resist composition is coated on a suitable substrate by a suitable coating technique in a desired coating weight.

In another embodiment, the resist film is formed by applying the chemically amplified positive resist composition onto an organic film to pre-form a resist film thereon, i.e., to construct a resist film laminate, and thereafter, transferring the resist film to a desired substrate.

First of all, in a clean room at a cleanness class of up to 1,000, the chemically amplified positive resist composition (solution) is coated on a thermoplastic film (or parting substrate), using an applicator installed in a zone which is kept at a temperature of 5 to 45° C., preferably 15 to 35° C. and a humidity of 5 to 90%, preferably 10 to 70%. Suitable applicators include a forward roll coater, reverse roll coater, comma coater, die coater, lip coater, gravure coater, dip coater, air knife coater, capillary coater, raising and rising (R&R) coater, blade coater, bar coater, and extrusion molding machine. The resist solution is coated on a thermoplastic film while the film is preferably fed at a speed of 0.05 to 1,000 m/min, more preferably 0.1 to 500 m/min. After coating of the resist solution, the coated film is passed through an in-line dryer or hot air circulating oven preferably at 40 to 130° C. for 1 to 40 minutes, more preferably at 50 to 120° C. for 2 to 30 minutes, until the organic solvent and any volatiles are removed. By drying in this way, a resist film is formed on the thermoplastic film to yield a chemically amplified positive resist film laminate. A resist film may also be formed by infrared irradiation drying instead of the in-line dryer, or by plural drying means such as a combination of the in-line dryer and infrared irradiation drying, to remove the organic solvent. If necessary, a protective film (or another parting substrate) may be press bonded to the resist film laminate on a roll laminator, yielding a protected laminate.

In this way, the resist film may be continuously formed on the thermoplastic film as a length of resist film layer and taken up as a film roll, which is easy to handle. This is also true to the resist film laminate having the protective film formed thereon.

Like the thermoplastic film, the protective film used herein is not particularly limited as long as it does not adversely affect the shape or morphology of the resist film and can be separated from the resist film. The protective film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which has been treated with a parting agent.

Of these, PET and PE films are preferred because of appropriate flexibility.

Commercial available films may be used as well. Useful PET films are as mentioned above, and useful PE films include GF-8 (Tamapoly Co., Ltd.), PE FILM 0 TYPE (Nippa Corp.), Toretec 7332, Toretec 7111 and Toretec 7721 (Toray Advanced Film Co., Ltd.).

The thermoplastic film and the protective film each have a thickness of preferably 10 to 150 µm, more preferably 25 to 100 µm, from the viewpoints of stable film formation and anti-curling from the roll state wound around the windup mandrel.

On use, the protective film is peeled from the resist film in the laminate constructed as above. The peeling force of the protective film from the resist film is typically in a range of 0.1 to 500 gf/24 mm, when measured by the following method. The test is carried out according to JIS Z0237 "Test method of measuring peel adhesion of release liner from pressure-sensitive adhesive tape surface". The testing environment is under standard conditions (temperature 23±1° C., relative humidity 50±5%). The film piece used in the test has a width of 24 mm. The film width should be constant because the peel adhesion varies if the film width varies. Once a film piece of the predetermined width is furnished, measurement is carried out on a tester by peeling the protective film at an angle of 180° and a speed of 5.0±0.2 mm/sec. As to the measurement value, measurement values over the initial 25 mm portion are excluded, and an average of measurement values over the succeeding 50 mm portion is reported as the test data.

The resist film of the resist film laminate may be transferred to a desired substrate by bonding the resist film laminate to the substrate using a suitable laminator such as vacuum laminator and stripping the thermoplastic film.

The resist film preferably has a thickness of 1 to 100 µm, more preferably 5 to 50 µm, but is not limited thereto.

The resist film formation may be followed by the step (i-2) of heat treating (or prebaking) the resist film on a hotplate or in an oven preferably at 60 to 150° C. for 0.5 to 30 minutes, more preferably at 80 to 120° C. for 1 to 10 minutes, if desired.

Step (ii)

Step (ii) is to expose the resist film to radiation. The resist film is exposed to radiation such as UV, deep-UV, or EB, preferably radiation of wavelength 300 nm or longer, specifically 300 to 500 nm, optionally through a mask having a desired pattern. The exposure dose is preferably in the range of about 10 to 3,000 mJ/cm², more preferably about 20 to 2,000 mJ/cm².

After the exposure, (ii-2) the film may be heat treated (or PEB) on a hotplate or in an oven preferably at 60 to 150° C. for 1 to 30 minutes, more preferably at 80 to 120° C. for 1 to 10 minutes, if desired.

Step (iii)

Step (iii) is to dry etch the exposed resist film with an oxygen-containing gas for development. For dry etching, reactive ion etching (RIE) with an oxygen gas-containing plasma may be performed in a common dry etching system. For example, the chamber is purged of the interior gas. RIE may be performed under conditions including a pressure within the chamber of 5 to 500 mmTorr, an RF power of 0.05 to 600 W, preferably 50 to 500 W, oxygen supply at a flow rate of 5 to 1,000 sccm, preferably 10 to 500 sccm, and a time of 5 to 60 minutes, although the etching conditions are not limited thereto. The etching gas may be further mixed with a stable gas such as Ar, He or $N_2$ and/or an etching gas containing halogen such as fluorine, chlorine or bromine, typically in a proportion of up to 60% on a flow rate basis. During oxygen plasma RIE, a sufficient etching contrast is obtained in that the etching rate of the resist film in the exposed region is high and the etching rate of the resist film in the unexposed region is low. Finally, the resist film in the unexposed region is left behind, yielding a positive pattern.

Using the resulting pattern, a circuit forming step including plating, sputtering, evaporation or the like may be carried out to form a semiconductor substrate.

EXAMPLE

Examples of the invention are given below by way of illustration and not by way of limitation. All parts are by weight (pbw).

Preparation Example

A chemically amplified positive resist composition was prepared by dissolving Polymer 1, 2 or 3 as the base resin (A), and components (B) to (H) according to the formulation shown in Table 1, and filtering the solution through a membrane filter with a pore size of 1.0 µm.

The structure of Polymers 1 to 3 and components (B) to (H) in Table 1 are identified below. Mw and Mn of Polymer A are measured versus polystyrene standards by GPC using THF.

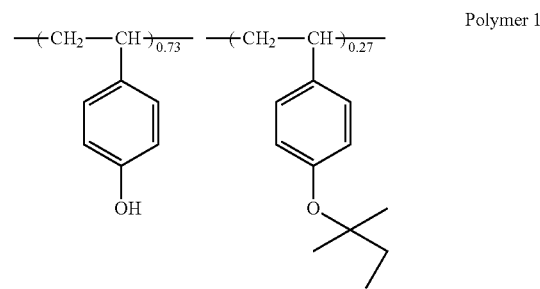

Polymer 1

Mw = 8,200
Mw/Mn = 1.60

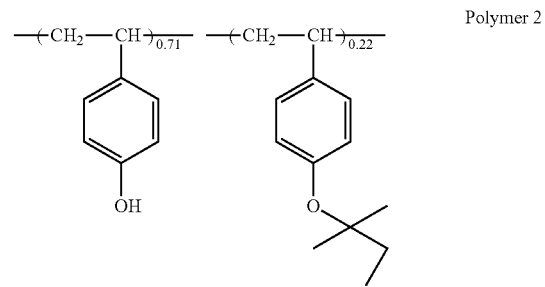

Polymer 2

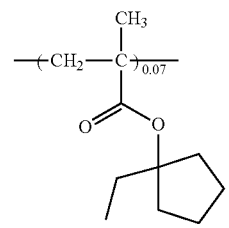

Mw = 15,000
Mw/Mn = 1.90

-continued

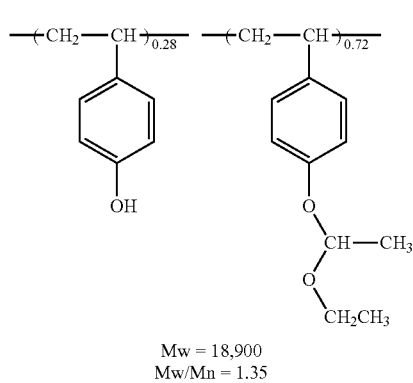

Polymer 3

Mw = 18,900
Mw/Mn = 1.35

(B) Photoacid Generator

PAG-1: PAI-101 by Midori Chemical Co., Ltd., 4-methylphenylsulfonyloxyimino-α-(4-methoxyphenyl)acetonitrile PAG-2: HT-1CS by San-Apro Co., Ltd.

(C) Organic Solvent
EL: ethyl lactate
CP: cyclopentanone
PMA: propylene glycol monomethyl ether acetate (D) Polyvinyl Alcohol or Polyvinyl Alkyl Ether
PVA1: polyvinyl alcohol (saponification degree 99 mol %, Mw=20,000)
PVA2: polyvinyl alcohol (saponification degree 88 mol %, Mw=35,000)
M40: Lutonal® M40 by BASF, 70% ethanol solution of polyvinyl methyl ether (Mw=51,000)
A25: Lutonal® A25 by BASF, polyvinyl ethyl ether (Mw=3,700)

(E) Basic Compound
TEA: triethanolamine (Kanto Chemical Co., Ltd.)

(F) Surfactant
S-1: X-70-093 (Shin-Etsu Chemical Co., Ltd.)

(G) Polyester Resin
PE1: adipic acid base polyester (Polysizer W-2050 by DIC Corp.)
PE2: adipic acid base polyester (D645 by J-Plus Co., Ltd.)

(H) Carboxylic Acid
OA: oxalic acid (Kanto Chemical Co., Ltd.)
BA: benzoic acid (Kanto Chemical Co., Ltd.)

TABLE 1

| | Components (pbw) | | | | | | | |
|---|---|---|---|---|---|---|---|---|
| | (A) | (B) | (C) | (D) | (E) | (F) | (G) | (H) |
| Composition #1 | Polymer 1 (100) | PAG-1 (1.0) | PMA (150) | A25 (15) | — | S-1 (0.05) | — | — |
| Composition #2 | Polymer 1 (100) | PAG-2 (1.5) | CP (150) | PVA1 (20) | TEA (0.02) | S-1 (0.05) | — | — |
| Composition #3 | Polymer 1 (100) | PAG-1 (1.5) | CP (100) EL (50) | M40 (30) | — | S-1 (0.05) | — | OA (0.005) |
| Composition #4 | Polymer 2 (100) | PAG-2 (1.0) | CP (100) PMA (50) | M40 (20) | TEA (0.05) | S-1 (0.05) | — | — |
| Composition #5 | Polymer 2 (100) | PAG-1 (1.5) | EL (100) PMA (50) | A25 (30) | — | S-1 (0.05) | PE1 (10) | — |
| Composition #6 | Polymer 2 (100) | PAG-1 (0.5) | EL (150) | PVA1 (10) | — | S-1 (0.05) | — | BA (0.01) |
| Composition #7 | Polymer 3 (100) | PAG-1 (2.0) | CP (75) PMA (75) | A25 (10) | — | S-1 (0.05) | PE2 (30) | — |
| Composition #8 | Polymer 3 (100) | PAG-2 (1.5) | CP (100) EL (50) | M40 (15) | — | — | PE1 (20) | — |
| Composition #9 | Polymer 1 (100) | PAG-1 (0.5) | PMA (100) EL (50) | PVA2 (30) | — | S-1 (0.05) | — | — |
| Composition #10 | Polymer 2 (100) | PAG-2 (2.0) | CP (100) EL (50) | A25 (70) | — | S-1 (0.05) | — | — |
| Composition #11 | Polymer 1 (100) | PAG-1 (1.5) | EL (150) | — | TEA (0.10) | S-1 (0.05) | — | — |
| Composition #12 | Polymer 2 (100) | PAG-2 (1.5) | CP (150) | — | — | S-1 (0.05) | — | OA (0.01) |
| Composition #13 | Polymer 3 (100) | PAG-1 (1.5) | EL (75) PMA (75) | — | — | S-1 (0.05) | PE2 (30) | — |
| Composition #14 | Polymer 3 (100) | PAG-2 (1.0) | CP (100) PMA (50) | — | — | — | PE1 (20) | — |

Examples 1 to 10 and Comparative Examples 1 to 4

Each of resist compositions #1 to #7 and #9 to #12 in Table 1 was spin coated on a 8-inch silicon wafer and prebaked on a hotplate at 100° C. for 120 seconds to form a resist film of 10 μm thick. Using a stepper NSR-2205i11 (Nikon Corp.), the resist film was exposed to radiation of wavelength 365 nm and baked (PEB) at 110° C. for 90 seconds.

Resist compositions #8, #13 and #14 in Table 1 were processed as follows. In a clean room at a cleanness class of 1,000, a temperature of 22-26° C. and a humidity of 40-45%, the resist composition was coated onto a PET film of 38 μm thick as the thermoplastic film by means of a die coater as the film coater, and dried in a hot air circulating oven at 100° C. for 5 minutes, yielding a chemically amplified positive resist film laminate. A PE film of 50 μm thick as the protective film was bonded to the surface of the resist film under a pressure of 1 MPa, completing the chemically amplified positive resist film laminate. The protective film was peeled from the resist film laminate. Using a vacuum laminator (TEAM-100M, Takatori Co., Ltd.) whose vacuum chamber was set at a vacuum of 80 Pa, the resist film on the thermoplastic film was transferred to a 8-inch silicon wafer. The temperature was 60° C. With the chamber restored to atmospheric pressure, the substrate was taken out of the laminator, and the thermoplastic film was peeled off. It was confirmed that the resist film of 10 μm thick was transferred to the wafer. Using a stepper NSR-2205i11 (Nikon Corp.), the resist film was exposed to radiation.

Next, the resist film was etched for 10 minutes by operating a dry etching system (DEM-451, Nichiden Anelva Co., Ltd.) under conditions: a reduced pressure of 0.01 Pa, an RF power of 200 W, and an $O_2$ flow rate of 60 sccm.

There was obtained a line-and-space pattern, which was observed under scanning electron microscope (S-4700 by Hitachi High-Technologies Corp.) to determine sensitivity and resolution. The sensitivity is an optimum exposure dose that provides iterations of 100-μm lines and spaces at 1:1. The maximum resolution is the minimum pattern size that is resolved at the optimum dose. The results are shown in Table 2. In Examples, the surface of the substrate after development was observed under SEM, finding no particle-like residues in the etched region.

TABLE 2

| | Composition | Dose (mJ/cm$^2$) | Resolution (μm, L/S) |
|---|---|---|---|
| Example 1 | Composition #1 | 300 | 40 |
| Example 2 | Composition #2 | 600 | 40 |
| Example 3 | Composition #3 | 200 | 50 |
| Example 4 | Composition #4 | 800 | 30 |
| Example 5 | Composition #5 | 100 | 60 |
| Example 6 | Composition #6 | 700 | 50 |
| Example 7 | Composition #7 | 50 | 50 |
| Example 8 | Composition #8 | 700 | 40 |
| Example 9 | Composition #9 | 500 | 40 |
| Example 10 | Composition #10 | 200 | 60 |
| Comparative Example 1 | Composition #11 | no film left in unexposed region | — |
| Comparative Example 2 | Composition #12 | no film left in unexposed region | — |
| Comparative Example 3 | Composition #13 | no film left in unexposed region | — |
| Comparative Example 4 | Composition #14 | no film left in unexposed region | — |

Japanese Patent Application No. 2017-030714 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A pattern forming process comprising the steps of:
   (i) applying a chemically amplified positive resist composition onto a substrate to form a resist film thereon, the resist composition comprising (A) a base resin containing a linear polymer having a phenolic hydroxyl group substituted with an acid labile group and adapted to turn alkali soluble as a result of the acid labile group being eliminated under the action of acid, (B) a photoacid generator, (C) an organic solvent, and (D) a polyvinyl alcohol or polyvinyl alkyl ether,
   (ii) exposing the resist film to radiation, and
   (iii) dry etching the exposed resist film with an oxygen-containing gas for development.
2. The process of claim 1, further comprising (i-2) heat treatment step between steps (i) and (ii).
3. The process of claim 1, further comprising (ii-2) heat treatment step between steps (ii) and (iii).
4. The process of claim 1 wherein the chemically amplified positive resist composition is in film form.
5. The process of claim 1 wherein the exposure step (ii) uses radiation of wavelength 300 to 500 nm.
6. The process of claim 1 wherein the resist composition comprises (A) 100 parts by weight of a base resin containing a polymer having a phenolic hydroxyl group substituted with an acid labile group and adapted to turn alkali soluble as a result of the acid labile group being eliminated under the action of acid, (B) 0.2 to 20 parts by weight of a photoacid generator, (C) 20 to 1,000 parts by weight of an organic solvent, and (D) 1 to 100 parts by weight of a polyvinyl alcohol or polyvinyl alkyl ether.
7. The process of claim 1 wherein the dry etching is performed under conditions including a pressure within the chamber of 5 to 500 mmTorr, an RF power of 0.05 to 600 W, oxygen supply at a flow rate of 5 to 1,000 sccm, and a time of 5 to 60 minutes.
8. The process of claim 1 wherein the linear polymer is a polymer comprising recurring units derived from hydroxystyrene or a derivative thereof wherein at least one hydrogen atom of a phenolic hydroxyl group is substituted by an acid labile group.
9. The process of claim 8 wherein the linear polymer is a polymer comprising recurring units having formulae (3-1) to (3-4):

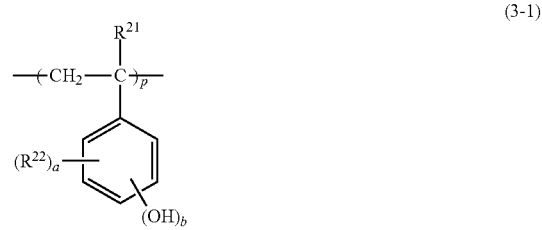

(3-1)

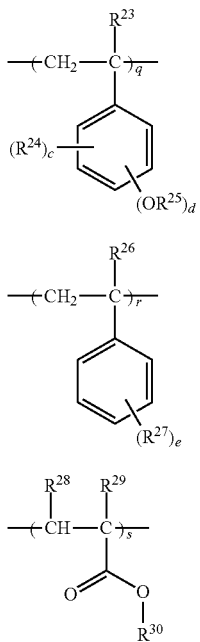

wherein R21, R23 and R26 are each independently hydrogen, hydroxyl, a C1-C6 straight or branched alkyl group, halogen, or trifluoromethyl group, R22 is halogen or a C1-C8 straight, branched or cyclic alkyl group, where two or more groups R22 are present, they may be identical or different, the subscripts a and b each are an integer in the range: $0 \leq a \leq 4$, $1 \leq b \leq 5$, and $1 \leq a+b \leq 5$, R24 is hydroxyl, halogen or a C1-C8 straight, branched or cyclic alkyl group, where two or more groups R24 are present, they may be identical or different.

R25 is an acid labile group selected from the group consisting of groups of the formula (2-1), groups of the formula (2-2), groups of the formula (2-3), trialkylsilyl groups and ketoalkyl groups, the subscripts c and d each are an integer in the range: $0 \leq c \leq 4$, $1 \leq d \leq 5$, and $1 \leq c+d \leq 5$, R27 is a C1-C12 alkyl group which may be substituted with fluorine, a C1-C12 primary or secondary alkoxy group which may be substituted with fluorine, -C(CF3)2-OH, or a trialkylsilyl group in which each alkyl moiety has 1 to 6 carbon atoms, the subscript e is an integer of 0 to 5, preferably 0 to 4, R28 is hydrogen or methyl, R29 is hydrogen, methyl, C2-C6 alkoxycarbonyl, cyano, halogen or trifluoromethyl, R30 is a substituted or unsubstituted C4-C30 straight, branched or cyclic alkyl group, and p, q, r and s are numbers satisfying $0 \leq p < 1$, $0 < q \leq 1$, $0 \leq r < 1$, $0 \leq s < 1$, and $p+q+r+s = 1$,

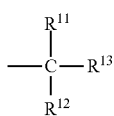

(2-1)

(2-2)

(2-3)

wherein R11 to R13 are each independently a C1-C8 straight, branched or cyclic alkyl group, a pair of R11 and R12, R11 and R13, or R12 and R13 may bond together to form a ring with the carbon atom to which they are attached, each participant of R11, R12 and R13 is independently a C1-C16 straight or branched alkylene group when they form a ring, R14 and R15 are each independently hydrogen or a C1-C8 straight or branched alkyl group, R16 is a C1-C10 straight, branched or cyclic alkyl group, a pair of R14 and R15, R14 and R16, or R15 and R16 may bond together to form a ring with the carbon atom or the carbon and oxygen atoms to which they are attached, each participant of R14, R15 and R16 is independently a C1-C6 straight or branched alkylene group when they form a ring, R17 is a C4-C40 tertiary alkyl group, and "A" is an integer of 0 to 6.

10. The process of claim 9 wherein the linear polymer is a polymer selected from the group consisting of binary polymer (A-1), ternary polymers (A-2), (A-3) and (A-4), and quaternary polymer (A-5):

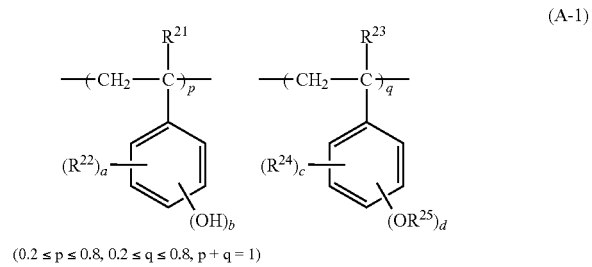

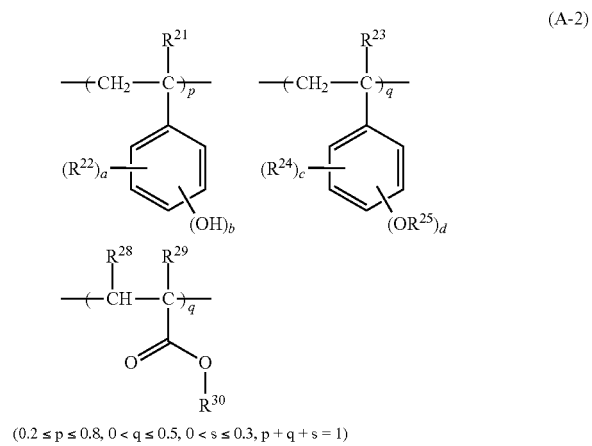

(A-3)
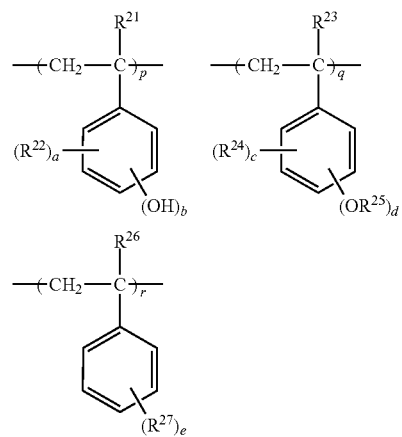
$(0.1 \leq p \leq 0.8, 0 < q \leq 0.5, 0.1 \leq r \leq 0.5, p+q+r = 1)$
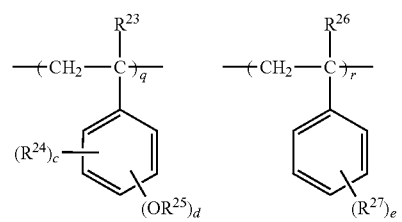
(A-4)
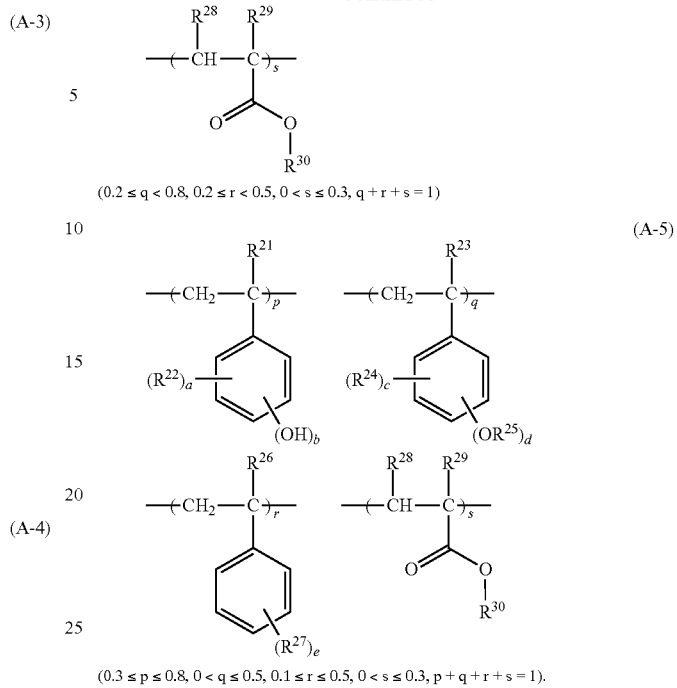
$(0.2 \leq q < 0.8, 0.2 \leq r < 0.5, 0 < s \leq 0.3, q+r+s = 1)$
(A-5)
$(0.3 \leq p \leq 0.8, 0 < q \leq 0.5, 0.1 \leq r \leq 0.5, 0 < s \leq 0.3, p+q+r+s = 1)$.
* * * * *